United States Patent
Umeda et al.

(10) Patent No.: US 9,885,113 B2
(45) Date of Patent: Feb. 6, 2018

(54) VAPORIZER, CENTER ROD USED THEREIN, AND METHOD FOR VAPORIZING MATERIAL CARRIED BY CARRIER GAS

(75) Inventors: Masaru Umeda, Tokyo (JP); Masayuki Toda, Fukushima (JP)

(73) Assignees: KABUSHIKI KAISHA WATANABE SHOKO, Tokyo (JP); Masayuki Toda, Fukushima (JP)

( * ) Notice: Subject to any disclaimer, the term of this patent is extended or adjusted under 35 U.S.C. 154(b) by 349 days.

(21) Appl. No.: 14/001,910

(22) PCT Filed: Feb. 27, 2012

(86) PCT No.: PCT/JP2012/054803
§ 371 (c)(1),
(2), (4) Date: Nov. 5, 2013

(87) PCT Pub. No.: WO2012/118019
PCT Pub. Date: Sep. 7, 2012

(65) Prior Publication Data
US 2014/0050852 A1 Feb. 20, 2014

(30) Foreign Application Priority Data
Feb. 28, 2011 (JP) ................... 2011-041962

(51) Int. Cl.
*C23C 16/448* (2006.01)
(52) U.S. Cl.
CPC ................. *C23C 16/4481* (2013.01)
(58) Field of Classification Search
USPC .............. 429/171; 55/355; 277/590
See application file for complete search history.

(56) References Cited

U.S. PATENT DOCUMENTS 1,930,285 A * 10/1933 Robinson .................. B64C 3/00
114/79 W
3,361,133 A * 1/1968 Kimberley ............. A61B 17/12
279/3

(Continued)

FOREIGN PATENT DOCUMENTS

| JP | 2004-158543 | 6/2004 |
| JP | 2005-268367 | 9/2005 |

(Continued)

OTHER PUBLICATIONS

International Search Report, PCT/JP2012/054803, dated May 29, 2012.

*Primary Examiner* — Alissa Tompkins
*Assistant Examiner* — John Bargero
(74) *Attorney, Agent, or Firm* — Young & Thompson (57) ABSTRACT

To obtain a vaporizer in which thin film-forming raw material solutions are stably and reliably carried by a carrier gas while being reliably separated within the dispersion unit body and the plurality of thin film-forming raw material solutions are stably vaporized in the subsequent vaporization unit, a center rod used in the vaporizer, and a method for vaporizing raw materials entrained by a carrier gas. A carrier gas introduction bore is formed in the center axis direction of the dispersion unit body. A center rod is inserted in the carrier gas introduction bore. The interspace between the inner wall of the bore and the outer wall of the rod forms a gas passage. Multiple thin film-forming material supply units are situated midway of the gas passage of the dispersion unit body, supplying thin film-forming materials. The center rod has sealing members in the longitudinal direction of the center rod.

6 Claims, 5 Drawing Sheets

(56) References Cited

U.S. PATENT DOCUMENTS

| | | | | |
|---|---|---|---|---|
| 5,934,175 A | * | 8/1999 | Vatel | ............ F15B 15/1419 |
| | | | | 277/435 |
| 6,540,840 B1 | * | 4/2003 | Toda | ............ C23C 16/4486 |
| | | | | 118/726 |
| 8,897,627 B2 | | 11/2014 | Toda | |
| 9,020,332 B2 | | 4/2015 | Toda | |
| 9,108,120 B2 | | 8/2015 | Toda | |
| 2004/0261747 A1 | * | 12/2004 | Crall | ............ F01L 1/18 |
| | | | | 123/190.17 |
| 2006/0278166 A1 | * | 12/2006 | Yamoto et al. | ............ 118/726 |
| 2012/0040098 A1 | * | 2/2012 | Toda | ............ B01B 1/005 |
| | | | | 427/255.23 |

FOREIGN PATENT DOCUMENTS

| | | |
|---|---|---|
| JP | 2010180433 A | 8/2010 |
| WO | 2005020302 | 3/2005 |

* cited by examiner

VAPORIZER, CENTER ROD USED THEREIN, AND METHOD FOR VAPORIZING MATERIAL CARRIED BY CARRIER GAS

TECHNICAL FIELD

The present invention relates to a vaporizer vaporizing film-forming liquid material dispersed in and entrained by a carrier gas, a center rod used in the vaporizer, and a method for vaporizing raw materials contained in a carrier gas, and is particularly characterized by placing an O-ring on the center rod installed in the dispersion unit body of the vaporizer so that a plurality of thin film-forming materials are stably and reliably carried by a carrier gas while being separated within the dispersion unit and vaporized in the subsequent vaporization unit.

BACKGROUND ART

In the prior art film-forming apparatus forming a film on the surface of a semiconductor wafer using a CVD device including a MOCVD device or the like, the technique of supplying a carrier gas containing film-forming liquid materials into a vaporizer and vaporizing the raw materials in the vaporizer is known.

Furthermore, with the above vaporizer, a heater is provided around the vaporizer or around the pipe through which the carrier gas is supplied into the vaporizer so as to vaporize the raw material with heat from the heater (for example, Patent Literature 1 to 3).

Furthermore, Patent Literature 4 discloses a technique of introducing liquid raw material into a carrier gas, dispersing the liquid raw material atomized to the order of a micron or smaller (1 micron or smaller) in size in the carrier gas (hereafter, a carrier gas in which liquid raw materials are dispersed is referred to as raw material gas), introducing the raw material gas into a vaporizer to vaporize the raw material, and then forming a film in the film-forming chamber. In doing so, a means for cooling the exit is provided to prevent clogging at the exit as a result of only the solvent evaporating. Furthermore, the liquid raw material is dispersed in a carrier gas as finer particles; therefore, the flow rate of the carrier gas is preferably 50 to 340 msec.

However, when a film is formed by the above technique, the film sometimes has a ripple on the surface. Furthermore, the presence of particles in the film or on its surface is observed. Furthermore, the film sometimes has a composition deviated from the target composition. Furthermore, the presence of particles in the film or on its surface is observed. Furthermore, the film sometimes has a composition deviated from the target composition. Furthermore, an increased content of carbon is sometimes observed.

Figure 6:
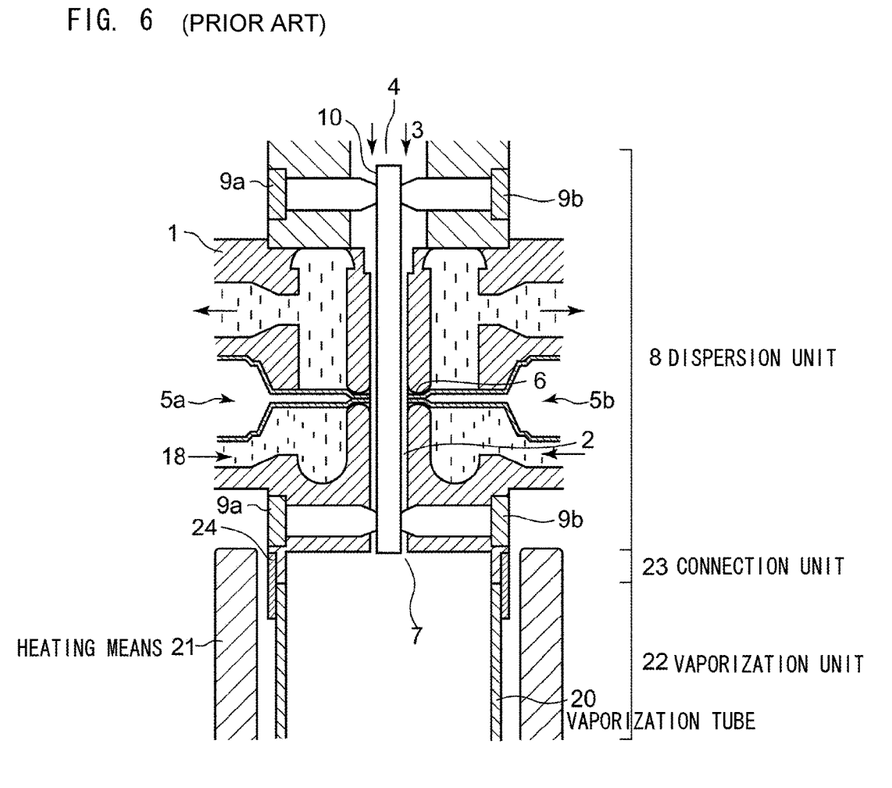
FIG. 6 is an illustration of a prior art vaporizer.

FIG. 6 is an illustration of a prior art vaporizer disclosed in FIG. 15 of Patent Literature 4. The vaporizer is formed by sequentially connecting the body of a dispersion unit 8, a connection unit 23, and a vaporization unit 22.

CITATION LIST

Patent Literature

Patent Literature 1: Japanese Unexamined Patent Application Publication No. H11-186170;
Patent Literature 2: Japanese Publication No. 2000-031134;
Patent Literature 3: Japanese Publication No. 2003-224118;
Patent Literature 4: International Publication WO02/058141; and
Patent Literature 5: Japanese Publication No. 2010-180433.

SUMMARY OF INVENTION

Technical Problem

In the prior art vaporizer, a first thin film-forming raw material solution and a second thin film-forming raw material solution are unnecessarily mixed within the gas passage of the dispersion unit body. This hinders the stable vaporization of the first thin film-forming raw material solution and second thin film-forming raw material solution in the subsequent vaporization unit.

An exemplary objective of the present invention is to provide a vaporizer in which a plurality of thin film-forming raw material solutions are stably and reliably carried by a carrier gas while being reliably separated within the dispersion unit body and the plurality of thin film-forming raw material solutions are each stably vaporized in the subsequent vaporization unit, a center rod used in the vaporizer, and a method for vaporizing raw materials entrained by a carrier gas.

Solution to Problem

The present invention provides a vaporizer characterized by placing rod-shaped sealing members or a sealing member such as an O-ring on the center rod installed in the dispersion unit body of the vaporizer to prevent a plurality of thin film-forming materials from mixing in the dispersion unit body.

The vaporizer according to an embodiment of the present invention is a vaporizer formed by sequentially connecting the body of a dispersion unit, a connection unit, and a vaporization unit, wherein the dispersion unit body has a carrier gas introduction bore formed in the center axis direction of the dispersion unit body, a center rod is inserted in the carrier gas introduction bore so that the interspace between the inner wall of the carrier gas introduction bore and the outer wall of the center rod forms a gas passage, thin film-forming material supply units formed at multiple points situated midway of the gas passage of the dispersion unit body and supplying thin film-forming materials are provided, a cooling unit provided on the outer periphery of the carrier gas introduction bore of the dispersion unit body and cooling the gas passage is provided, and the center rod has a sealing member provided in the longitudinal direction of the center rod.

In another embodiment, the sealing member is closely attached between a groove A formed on the center rod and a groove B formed on the outer wall of the dispersion unit body.

In another embodiment, the outer wall of the dispersion unit body comprises a first outer wall and a second outer wall, the center rod is closely attached via the sealing member, and the first and second outer walls are fixed by stoppers each formed on the outer side.

In another embodiment, the material of the sealing member is any of nitrile rubber, styrol rubber, silicone rubber, and fluoro rubber.

The center rod of one embodiment is a center rod placed in the carrier gas passage of the dispersion unit body of a vaporizer, wherein the center rod is in the shape of a cylinder and has arc-shaped grooves A formed in the longitudinal direction of the side or along the longitudinal direction of the side and the top and bottom faces for closely attaching a sealing member.

In another embodiment of the center rod, the sealing member consists of multiple rod-shaped sealing members or an O-ring.

In a different center rod embodiment, the material of the sealing member is any of nitrile rubber, styrol rubber, silicone rubber, and fluoro rubber.

One method embodiment is a method for vaporizing raw materials entrained by a carrier gas, wherein a carrier gas is introduced into a gas passage formed by the interspace between the inner wall of a carrier introduction bore formed in the dispersion unit body and the outer wall of a center rod inserted in the carrier gas introduction bore, and thin film-forming materials are introduced from multiple points situated midway of the gas passage so that the thin film-forming materials are dispersed in a carrier gas, a sealing member is placed in the longitudinal direction of the center rod to prevent the carrier gas in which the thin film-forming materials are dispersed from mixing, the carrier gas in which the thin film-forming materials are dispersed is converged in a connection unit where the center rod tip situated at the downstream end of the gas passage guides the carrier gas to come closer to each other, and then the thin film-forming materials are vaporized in the vaporization unit.

In a further method embodiment, the sealing member is closely attached between a groove A formed on the center rod and a groove B formed on the outer wall of the dispersion unit body.

In an additional method embodiment, the outer wall of the dispersion unit body comprises a first outer wall and a second outer wall, the center rod is closely attached via the sealing member, and the first and second outer walls are fixed by stoppers each formed on the outer side.

In a further method embodiment, the sealing member consists of rod-shaped sealing members or an O-ring.

In another embodiment, the material of the sealing member is any of nitrile rubber, styrol rubber, silicone rubber, and fluoro rubber.

Also disclosed is a vaporizer formed by sequentially connecting a unit preceding a vaporization chamber and a vaporization unit, wherein the dispersion unit body has a gas introduction bore formed in the center axis direction of the dispersion unit body, a center rod is inserted in the carrier gas introduction bore so that the interspace between the inner wall of the carrier gas introduction bore and the outer wall of the center rod forms a gas passage, a cooling unit provided on the outer periphery of the carrier gas introduction bore of the dispersion unit body and cooling the gas passage is provided, and the center rod has a sealing member provided in the longitudinal direction of the center rod.

Advantageous Effects of Invention

The vaporizer can provide a vaporizer in which a plurality of thin film-forming materials are stably and reliably carried by a carrier gas while being reliably separated within the dispersion unit and vaporized in the subsequent vaporization unit.

Installed in the dispersion unit body, the center rod can stably and reliably separate a plurality of thin film-forming materials within the dispersion unit body.

The method for vaporizing a carrier gas can provide a method for vaporizing raw materials entrained by a carrier gas by which a plurality of thin film-forming materials are stably and reliably carried by a carrier gas while being reliably separated within the dispersion unit and vaporized in the subsequent vaporization unit.

The vaporizer can introduce a plurality of thin film-forming materials and a carrier gas into the unit preceding the vaporization chamber and stably vaporize them when the thin film-forming materials are liquid and a bubbling method is used.

The present invention can provide a vaporizer in which a plurality of thin film-forming materials are stably and reliably carried by a carrier gas while being reliably separated within the dispersion unit and the plurality of raw material gasses are each stably vaporized in the subsequent vaporization unit, a center rod used in the vaporizer, and a method for vaporizing raw materials entrained by a carrier gas.

BRIEF DESCRIPTION OF DRAWINGS

FIG. 1 (*a*) is a perspective view of the center rod on which two rod-shaped sealing members are mounted and FIG. 1 (*b*) is a top view of the center rod and two rod-shaped sealing members in FIG. 1 (*a*) after installed in the dispersion unit body;

FIG. 2 (*a*) is a perspective view of the center rod on which four rod-shaped sealing members are mounted and FIG. 2 (*b*) is a top view of the center rod and four rod-shaped sealing members in FIG. 2 (*a*) after installed in the dispersion unit body;

FIG. 3 (*a*) is a perspective view of the center rod on which an O-ring is mounted and FIG. 3 (*b*) is a top view of the center rod in FIG. 3 (*a*) after installed in the dispersion unit body;

FIG. 4 (*a*) is a perspective view of the center rod on which an O-ring is mounted and FIG. 4 (*b*) is a top view of the center rod in FIG. 4 (*a*) after installed in the dispersion unit body;

REFERENCE SIGNS LIST

1 Dispersion unit body
2 Gas passage
3 Carrier gas
4 Gas inlet
5*a* First thin film-forming raw material solution
5*b* Second thin film-forming raw material solution
5*c* Third thin film-forming raw material solution
5*d* Fourth thin film-forming raw material solution
5*e* Fifth thin film-forming raw material solution
5*f* Sixth thin film-forming raw material solution
6 Raw material feed orifice
7 Gas outlet
8 Dispersion unit body
9*a*, 9*b*, 9*c*, 9*d* Vis
10, 10*a*, 10*b* Center rod
11 O-ring
11*a*, 11*b*, 11*c*, 11*d* Rod-shaped sealing member 12a, 12b Groove A
13a, 13b, 13c Groove B
14 Outer block of dispersion unit body
15a First outer block division
15b Second outer block division
16 Stopper
17 Notch
18 Cooling water
20 Vaporization tube
21 Heating means
22 Vaporization unit
23 Connection unit
24 Joint

DESCRIPTION OF EMBODIMENTS

The vaporizer according to the present invention is a vaporizer formed by sequentially connecting the body of a dispersion unit, a connection unit, and a vaporization unit, wherein the dispersion unit body has a carrier gas introduction bore formed in the center axis direction of the dispersion unit body, a center rod is inserted in the carrier gas introduction bore so that the interspace between the inner wall of the carrier gas introduction bore and the outer wall of the center rod forms a gas passage, thin film-forming material supply units formed at multiple points situated midway of the gas passage of the dispersion unit body and supplying thin film-forming materials are provided, a cooling unit provided on the outer periphery of the carrier gas introduction bore of the dispersion unit body and cooling the gas passage is provided, and the center rod has rod-shaped sealing members or a sealing member such as an O-ring provided in the longitudinal direction of the center rod.

The center rod used in a vaporizer according to the present invention is a center rod placed in the carrier gas passage of the dispersion unit body of a vaporizer, wherein the center rod is in the shape of a cylinder and has arc-shaped grooves A along the longitudinal direction of the side and the top and bottom faces for closely attaching rod-shaped sealing members or a sealing member such as an O-ring.

Furthermore, the center rod according to the present invention is a center rod placed in the carrier gas passage of the dispersion unit body of a vaporizer, wherein the center rod is in the shape of a cylinder having a notch in the upper part and has arc-shaped grooves A along the longitudinal direction of the side, the surface in the interspace, and the bottom face for closely attaching rod-shaped sealing members or a sealing member such as an O-ring.

The method for vaporizing raw materials entrained by a carrier gas according to the present invention is a method for vaporizing raw materials entrained by a carrier gas, wherein a carrier gas is introduced into a gas passage formed by the interspace between the inner wall of a carrier introduction bore formed in the dispersion unit body and the outer wall of a center rod inserted in the carrier gas introduction bore, thin film-forming materials are introduced from multiple points situated midway of the gas passage so that the thin film-forming materials are dispersed in a carrier gas, a sealing member is placed in the longitudinal direction of the center rod to prevent the carrier gas in which the thin film-forming materials are dispersed from mixing, the carrier gas in which the thin film-forming materials are dispersed is converged in a connection unit where the center rod tip situated at the downstream end of the gas passage guides the carrier gas to come closer to each other, and then the thin film-forming materials are vaporized in the vaporization unit.

EMBODIMENTS

Embodiments of the vaporizer of the present invention will be described hereafter.

Embodiment 1

Figure 1:
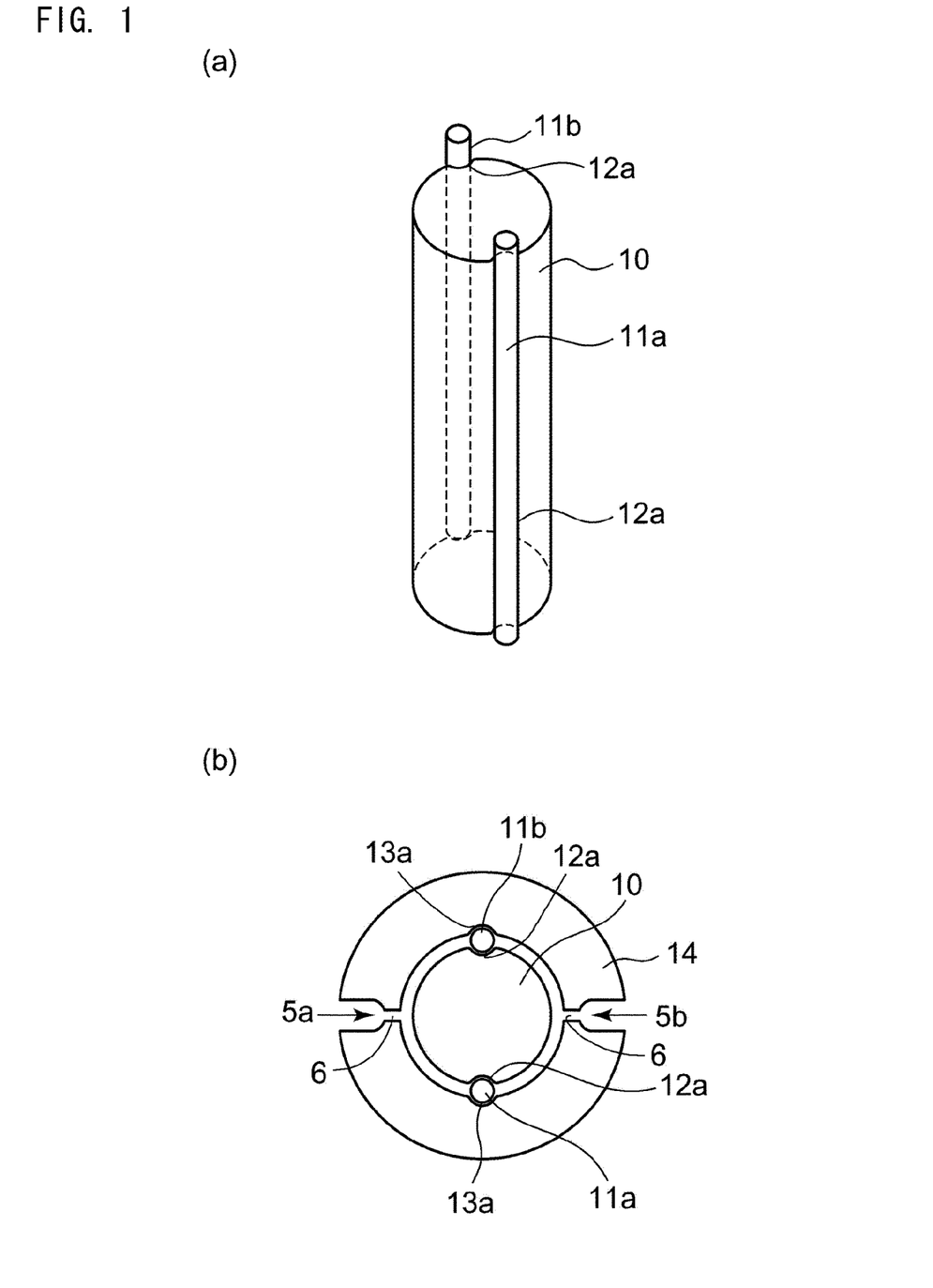
FIG. 1 is an illustration of the vaporizer according to Embodiment 1 of the present invention.

FIG. 1 is an illustration of the vaporizer according to Embodiment 1 of the present invention. FIG. 1 (a) is a perspective view of the center rod on which two rod-shaped sealing members are mounted and FIG. 1 (b) is a top view of the center rod and two rod-shaped sealing members in FIG. 1 (a) after installed in the dispersion unit body.

In FIG. 1 (a), a center rod 10 is in the shape of a cylinder having grooves A 12a on the longitudinal side and top and bottom faces. Rod-shaped sealing members 11a and 11b are mounted in the grooves A 12a. The rod-shaped sealing members 11a and 11b are made of nitrile rubber, styrol rubber, silicone rubber, or fluoro rubber, or consist of rod-shaped metal sealing members when heat resistance is particularly required. Here, the center rod is made of a stainless material.

FIG. 1 (b) is a top view of the center rod 10 in FIG. 1 (a) after installed in an outer block 14 of the dispersion unit body. Here, the center rod 10 is pressed in with the rod-shaped sealing members 11a and 11b fitted in the grooves B 13a formed on the outer block 14 of the dispersion unit body, placed at a given position, and fixed. Introduced into the gas passage from raw material feed orifices 6, a first thin film-forming raw material solution 5a and second thin film-forming raw material solution 5b are reliably separated by the rod-shaped sealing members 11a and 11b and sent to the subsequent vaporization unit. In FIG. 1, though not shown, the rod-shaped sealing members 11a and 11b can be connected on the top face of the center rod.

Embodiment 2

Figure 2:
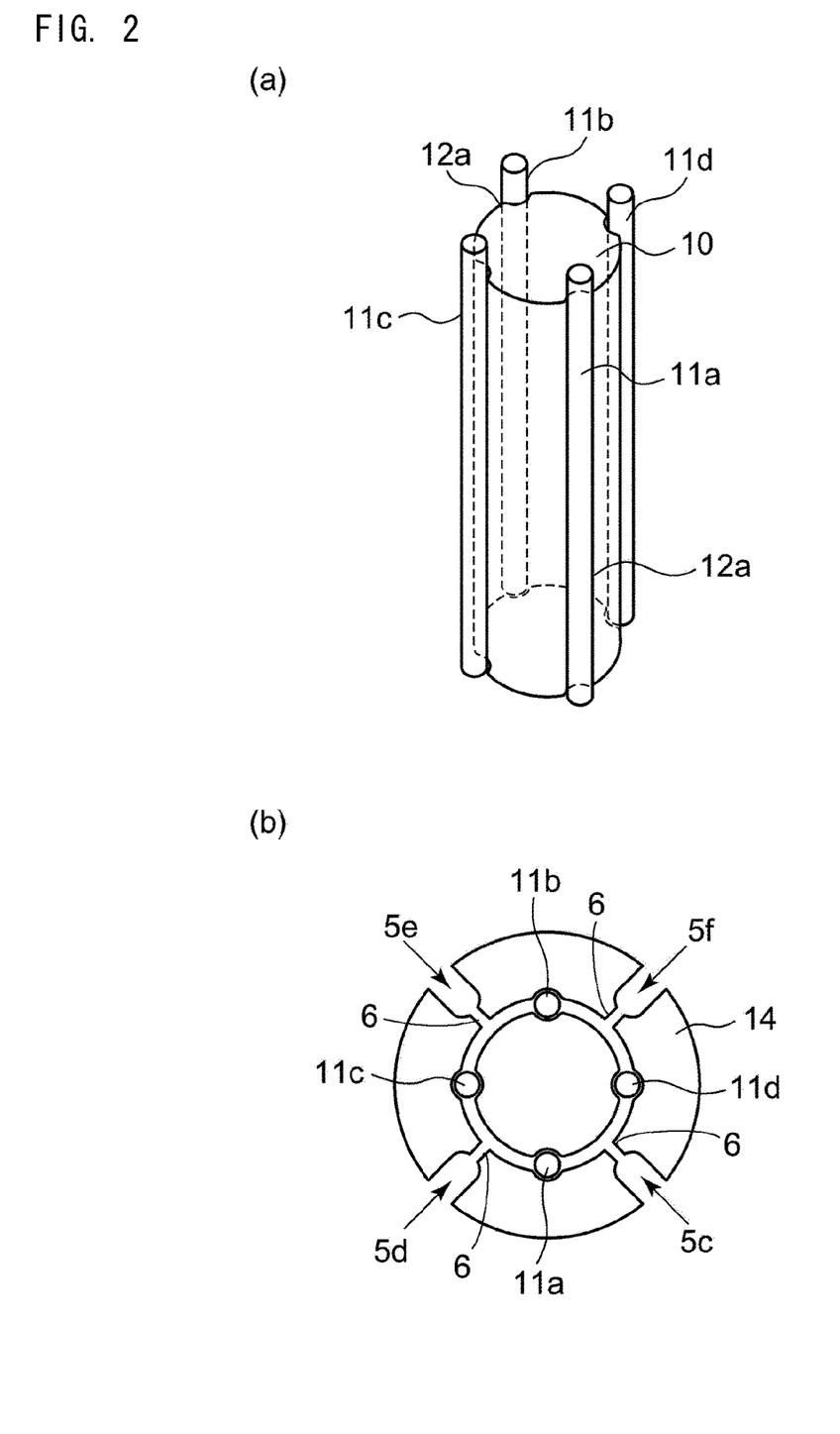
FIG. 2 is an illustration of the vaporizer according to Embodiment 2 of the present invention.

FIG. 2 is an illustration of the vaporizer according to Embodiment 2 of the present invention. FIG. 2 (a) is a perspective view of the center rod on which four rod-shaped sealing members are mounted and FIG. 2 (b) is a top view of the center rod and four rod-shaped sealing members in FIG. 2 (a) after installed in the dispersion unit body.

In FIG. 2 (a), a center rod 10 is in the shape of a cylinder having grooves A 12a on the longitudinal side and top and bottom faces. Rod-shaped sealing members 11a, 11b, 11c, and 11d are mounted in the grooves A 12a. The rod-shaped sealing members 11a, 11b, 11c, and 11d are made of nitrile rubber, styrol rubber, silicone rubber, or fluoro rubber, or consist of rod-shaped metal sealing members when heat resistance is particularly required.

Here, the center rod is made of a stainless material.

FIG. 2 (b) is a top view of the center rod 10 in FIG. 2 (a) after installed in the outer block 14 of the dispersion unit body. Here, the center rod 10 is pressed in with the rod-shaped sealing members 11a, 11b, 11c, and 11d fitted in the grooves B 13a formed on the outer block 14 of the dispersion unit body, placed at a given position, and fixed. Introduced into the gas passage from raw material feed orifices 6, a third thin film-forming raw material solution 5c, fourth thin film-forming raw material solution 5d, fifth thin film-forming raw material solution 5e, and sixth thin film-forming raw material solution 5f are reliably separated by the rod-shaped sealing members 11a, 11b, 11c, and 11d and sent to the subsequent vaporization unit. In FIG. 2, though not shown, at least two of the rod-shaped sealing members 11a, 11b, 11c, and 11d can be connected on the top face of the center rod.

Embodiment 3

Figure 3:
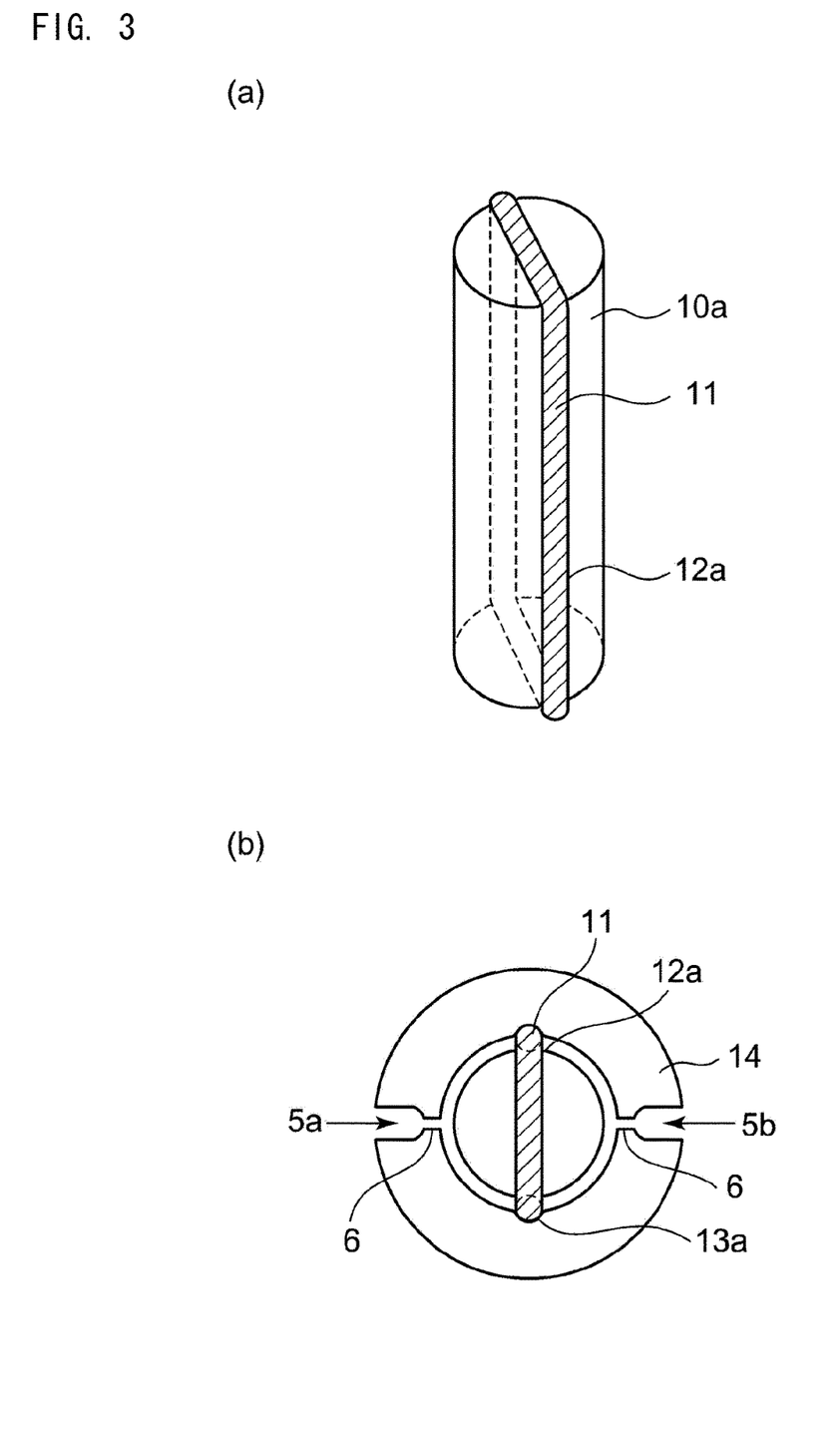
FIG. 3 is an illustration of the center rod used in a vaporizer according to Embodiment 3 of the present invention.

FIG. 3 is an illustration of the center rod used in Embodiment 3 of the present invention. FIG. 3 (a) is a perspective view of the center rod on which an O-ring is mounted and FIG. 3 (b) is a top view of the center rod in FIG. 3 (a) after installed in the dispersion unit body.

In FIG. 3 (a), a center rod 10a is in the shape of a cylinder having grooves A on the longitudinal side and top and bottom faces. An O-ring 11 is mounted in the grooves A.

The O-ring 11 is made of nitrile rubber, styrol rubber, silicone rubber, or fluoro rubber, or consists of a metal O-ring when heat resistance is particularly required. Here, the center rod is made of a stainless material.

FIG. 3 (b) is a top view of the center rod 10a in FIG. 3 (a) after installed in the outer block 14 of the dispersion unit body. Here, the center rod 10a is pressed in with the O-ring 11 fitted in the grooves B 13a formed on the outer block 14 of the dispersion unit body, placed at a given position, and fixed. Introduced into the gas passage from the raw material feed orifices 6, the first thin film-forming raw material solution 5a and second thin film-forming raw material solution 5b are reliably separated by the O-ring 11 and sent to the subsequent vaporization unit.

Embodiment 4

Figure 4:
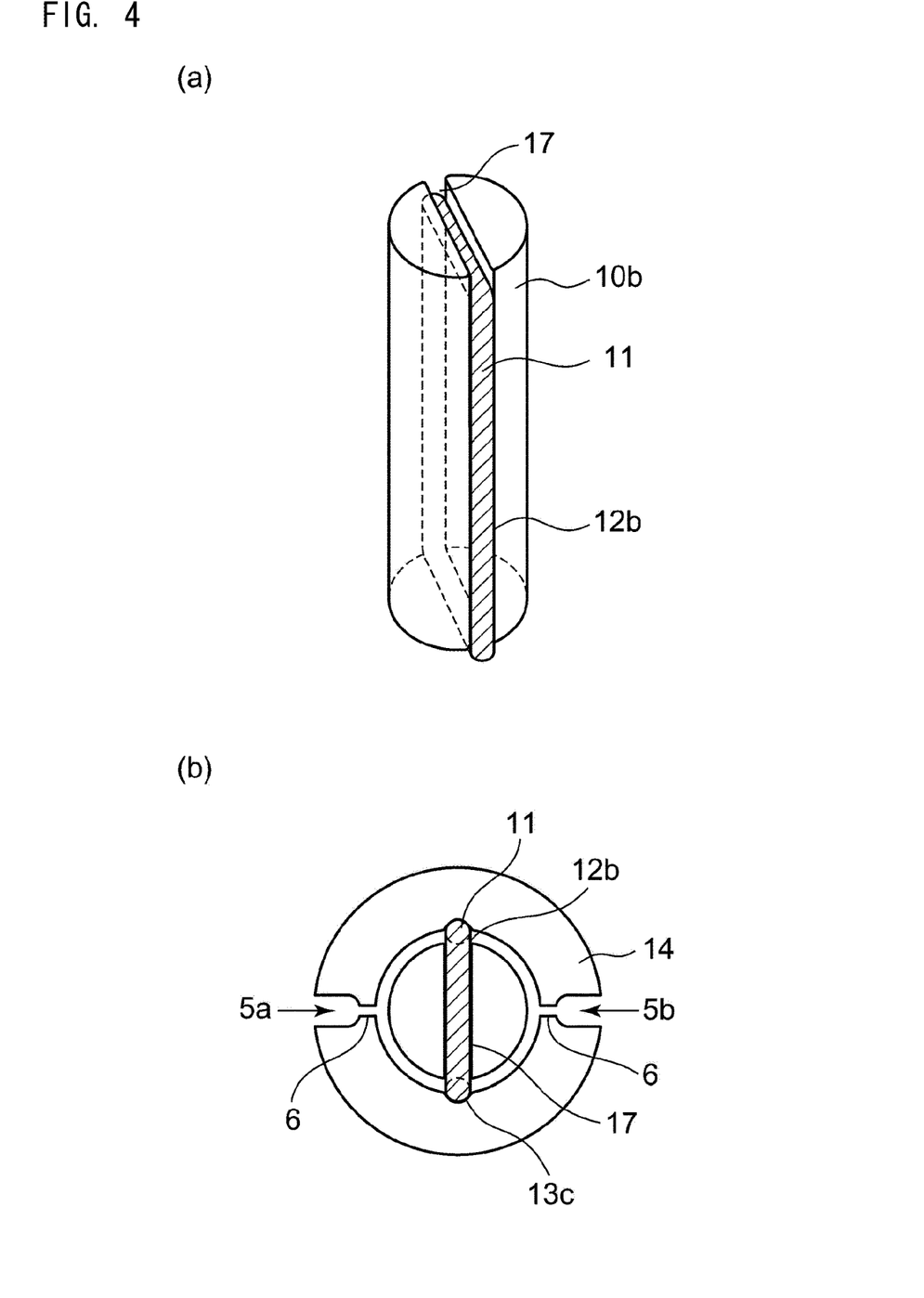
FIG. 4 is an illustration of the center rod used in a vaporizer according to Embodiment 4 of the present invention.

FIG. 4 is an illustration of the center rod used in a vaporizer of Embodiment 4 of the present invention. FIG. 4 (a) is a perspective view of the center rod on which an O-ring is mounted and FIG. 4 (b) is a top view of the center rod in FIG. 4 (a) after installed in the dispersion unit body. In FIG. 4 (a), a center rod 10b is in the shape of a cylinder having a notch 17 in the upper part and grooves A 12b on the longitudinal side, the surface of the notch 17, and the bottom face. An O-ring 11 is mounted in the grooves A 12b. The O-ring 11 is made of nitrile rubber, styrol rubber, silicone rubber, or fluoro rubber, or consists of a metal O-ring when heat resistance is particularly required. Here, the center rod is made of a stainless material.

FIG. 4 (b) is a top view of the center rod 10b in FIG. 4 (a) after installed in the outer block 14 of the dispersion unit body. Here, the center rod 10b is pressed in with the O-ring 11 fitted in the grooves B 13c formed on the outer block 14 of the dispersion unit body, placed at a given position, and fixed. Introduced into the gas passage from the raw material feed orifices 6, the first thin film-forming raw material solution 5a and second thin film-forming raw material solution 5b are reliably separated by the O-ring 11 and sent to the subsequent vaporization unit. Here, the notch 17 is effective for holding the O-ring more stably. The O-ring 11 is made of nitrile rubber, styrol rubber, silicone rubber, or fluoro rubber, or consists of a metal O-ring when heat resistance is particularly required.

Embodiment 5

Figure 5:
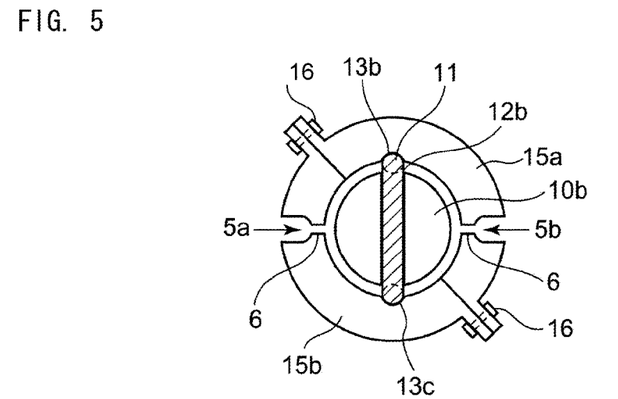
FIG. 5 is an illustration showing the divided outer block of the dispersion unit body according to Embodiment 5 of the present invention.

FIG. 5 is an illustration of the vaporizer of Embodiment 5 of the present invention in which the outer block of the dispersion unit body is divided. A center rod 10b in FIG. 5 is the center rod described in the above Embodiment 4. A first outer block division 15a and a second outer block division 15b each have a groove B on the inner side. The first and second outer block divisions 15a and 15b are attached to each other to clamp the O-ring on the center rod and fixed by stoppers 16. Introduced into the gas passage from the raw material feed orifices 6, the first thin film-forming raw material solution 5a and second thin film-forming raw material solution 5b are reliably separated by the O-ring 11 and sent to the subsequent vaporization unit. Here, the notch 17 is effective for holding the O-ring more stably. The O-ring 11 is made of nitrile rubber, styrol rubber, silicone rubber, or fluoro rubber, or consists of a metal O-ring when heat resistance is particularly required. Here, the center rod is made of a stainless material.

INDUSTRIAL APPLICABILITY

The vaporizer, center rod used in the vaporizer, and method for vaporizing a carrier gas according to the present invention make it possible to provide a vaporizer capable of reliably separating a plurality of thin film-forming raw material solutions and sending them to the vaporization unit and realize a film-forming apparatus forming a stable thin film.

The invention claimed is:

1. A vaporizer formed by sequentially connecting the body of a dispersion unit, a connection unit, and a vaporization unit, wherein:
said dispersion unit body has a carrier gas introduction bore formed in the center axis direction of the dispersion unit body,
a center rod is inserted in said carrier gas introduction bore so that an interspace between an inner wall of said carrier gas introduction bore and an outer wall of said center rod forms a gas passage,
thin film-forming material supply units are provided at multiple points situated midway of said gas passage of said dispersion unit body and supplying thin film-forming materials, and
a sealing member is provided in the longitudinal direction and directly contacting both the center rod and the inner wall of said carrier gas introduction bore, said sealing member being in both a groove formed on said center rod and a groove formed on the inner wall of said carrier gas introduction bore.

2. The vaporizer according to claim 1, wherein an outer block of said dispersion unit body comprises a first outer block and a second outer block, said center rod is closely attached via said sealing member, and said first and second outer blocks are fixed by stoppers each formed on the outer side.

3. The vaporizer according to claim 1, wherein the material of said sealing member is any of nitrile rubber, styrol rubber, silicone rubber, and fluoro rubber.

4. The vaporizer according to claim 2, wherein the material of said sealing member is any of nitrile rubber, styrol rubber, silicone rubber, and fluoro rubber.

5. The vaporizer according to claim 1, wherein the material of said sealing member is different than a material of said center rod.

6. The vaporizer according to claim 1, wherein a groove is formed on an end surface on a carrier gas introduction side of the center rod.

* * * * *